United States Patent
Arase et al.

(10) Patent No.: US 6,927,266 B2
(45) Date of Patent: Aug. 9, 2005

(54) BOTTOM ANTI-REFLECTIVE COAT FORMING COMPOSITION FOR LITHOGRAPHY

(75) Inventors: Shinya Arase, Funabashi (JP); Takahiro Kishioka, Funabashi (JP); Ken-ichi Mizusawa, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 564 days.

(21) Appl. No.: 10/078,108

(22) Filed: Feb. 20, 2002

(65) Prior Publication Data

US 2002/0156148 A1 Oct. 24, 2002

(30) Foreign Application Priority Data

Feb. 22, 2001 (JP) ....................................... 2001-046779

(51) Int. Cl.⁷ .............................................. C08F 122/40
(52) U.S. Cl. ................. 526/262; 526/328.5; 430/270.1; 430/271.1; 430/325
(58) Field of Search .............................. 526/262, 328.5; 430/270.1, 271.1, 325

(56) References Cited

U.S. PATENT DOCUMENTS 6,503,421 B1 * 1/2003 Wang et al. ................. 252/582
6,803,168 B1 * 10/2004 Padmanaban et al. ... 430/270.1

FOREIGN PATENT DOCUMENTS

| DE | 40 39 334 A | 7/1991 |
| EP | 0 583 205 A | 2/1994 |
| EP | 0 823 661 A | 2/1998 |
| EP | 0 917 002 A | 5/1999 |
| EP | 0 942 331 A | 9/1999 |
| EP | 0 982 320 A | 3/2000 |
| JP | A 6-75378 | 3/1994 |
| WO | WO 02 25374 A | 3/2002 |

OTHER PUBLICATIONS

Lynch et al., "Properties and Performance of Near UV Reflectivity Control Layers", SPIE, vol. 2195, pp. 225–235, 1994.

Taylor et al., "Methacrylate Resists and Antireflective Coatings for 193 nm Lithography", SPIE, vol. 3678, pp. 174–185, 1999.

\* cited by examiner

*Primary Examiner*—Helen L. Pezzuto
(74) *Attorney, Agent, or Firm*—Oliff & Berridge, PLC

(57) ABSTRACT

The present invention relates to a bottom anti-reflective coat forming composition having the resin with the structural unit comprising maleimide or maleimide derivative for the lithography process in the preparation of semiconductor device. The resin comprises maleimide or derivative thereof in the principal chain or the side chain and its weight-average molecular weight is 700–1000000. The invention offers the bottom anti-reflective coating for lithography showing high anti-reflective effect, no intermixing with resist layer, excellent resist pattern, and large dry etching rate in comparison to resist.

6 Claims, No Drawings

BOTTOM ANTI-REFLECTIVE COAT FORMING COMPOSITION FOR LITHOGRAPHY

BACKGROUND OF THE INVENTION

1. Field of the Invention

The present invention relates to a novel bottom anti-reflective coat forming composition which reduces reflection of exposure irradiation light from said substrate toward the photoresist layer coated over the substrate, and more particularly, to the bottom anti-reflective coat forming composition having the resin which effectively absorbs exposure irradiation light at the wave-length of 193 nm.

2. Description of the Related Art

The fine processing with lithography using the photoresist composition has been conducted for the preparation of semiconductor device heretofore. Said fine processing is the processing method comprising forming a film of the photoresist composition over silicon wafer, irradiating active light rays such as UV light through the mask pattern over which the pattern of semiconductor device has been drawn, developing and executing the etching treatment of silicon wafer of thus obtained resist pattern as the protective film. However, the higher degree of integration of semiconductor device has been achieved in recent years and active light rays used show tendency toward preferring short wave length from KrF excimer laser (248 nm) to ArF excimer laser (193 nm). Along with this progress, effects of irregular reflection and standing wave of active light rays from the substrate have become the major concern. Therefore, the method of providing the bottom anti-reflective coating between the photoresist and the substrate has been extensively investigated.

Inorganic bottom anti-reflective coating made of such as titanium, titanium dioxide, nitrided titanium, chrome oxide, carbon, α-silicon and the like, and organic bottom anti-reflective coating made of light absorbing material and polymer compound as the bottom anti-reflective coating are known. The former requires facilities such as vacuum deposition equipment, CVD device, spattering device and the like, while the latter is advantageous since the latter does not require any special facilities and therefore various investigations have been conducted. Examples of as such are acryl resin type bottom anti-reflective coating with hydroxyl group as crosslinking forming functional group and light absorbing group in the same molecule disclosed in U.S. Pat. No. 5,919,599 and novolac resin type bottom anti-reflective coating with hydroxyl group as crosslinking forming functional group and light absorbing group in the same molecule described in U.S. Pat. No. 5,693,691 among others.

According to the LSI pattern rule having the degree of fineness for less than 0.13 μm, the delay in wiring affects speeding up of LSI and thus advancing high-performance of LSI with the present technology for the production of LSI has become difficult. Therefore, Cu wiring material and the interlaminar insulating film with low dielectric constant are used in order to minimize the delay in wiring.

The desirable physical properties for the organic type bottom anti-reflective coating materials are having high absorbance against light or irradiation rays, absence of intermixing with resist layer (insoluble in resist solvent), no diffusion of small molecule into overcoating resist from the bottom anti-reflective coating material when applied or dried with heating, having large dry etching rate in comparison with resist and the like, and these are also described in for example Proc. SPIE, Vol. 3678, 174–185 (1999) or in Proc. SPIE, Vol. 2195, 225–229 (1994).

WO98/54619 discloses the bottom anti-reflective coat forming composition comprising the polymer which comprises acrylic acid ester structural unit containing blocked isocyanate group or isothiocyanate group as the essential ingredient and further maleimide or derivative thereof as an optional ingredient. When this polymer comprises maleimide or derivative thereof, 0.05 to 0.50 mol percent is said to be preferred.

JP Patent No. Hei 6-75378 discloses the bottom anti-reflective coat forming composition comprising the imide reaction product between at least one amino aromatic chromophore and the polymer having anhydride group. Said bottom anti-reflective coat forming composition comprises the polymer to which aromatic chromophore is bound through imide bond upon for example the reaction of copolymer of maleic acid anhydride and methacryl acid methyl with aminoanthracene and benzylamine.

SUMMARY OF THE INVENTION

The subject of the present invention is to supply the composition forming the bottom anti-reflective coating for lithography used as the bottom anti-reflective coating which effectively prevents the reflection when irradiating light of especially 193 nm is used for fine processing and further which can be rapidly removed in the removing process. In addition, properties such as highly effective preventive effect for reflected light, no intermixing with resist layer, forming excellent resist pattern, and large dry etching rate in comparison with resist are required for said bottom anti-reflective coating. The further subject of the present invention is to provide the method of formation of resist pattern by the use of said bottom anti-reflective coat forming composition.

The first subject of the present invention relates to a bottom anti-reflective coat forming composition for the lithography process in the preparation of semiconductor device, wherein the bottom anti-reflective coat forming composition comprises resin containing a structural unit comprising maleimide or derivative thereof;

the second subject relates to the bottom anti-reflective coat forming composition according to the first subject, wherein said resin comprises the structural unit containing maleimide or derivative thereof in its principal chain or side chain;

the third subject relates to the bottom anti-reflective coat forming composition according to the first subject, wherein the resin comprises at least the structural unit shown in the Formula (1)

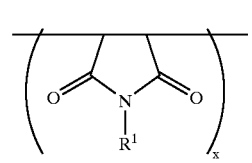

Formula (1)

wherein $R^1$ is hydrogen, halogen, substituted or unsubstituted $C_1$–$C_{10}$ alkyl group or benzene derivative; and x is number 7-10300, and is a polymer with weight-average molecular weight of 700–1000000;

the fourth subject relates to the bottom anti-reflective coat forming composition according to the first subject, wherein the resin comprises the structural unit shown in the Formula (2)

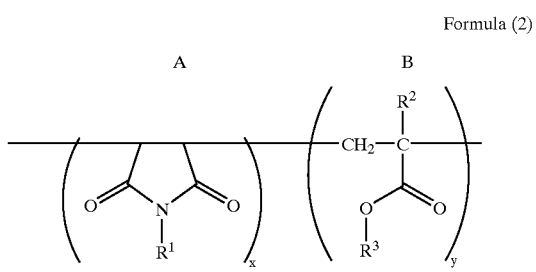

Formula (2)

wherein each $R^1$, $R^2$ and $R^3$ is independent of each other; $R^1$ is hydrogen, halogen, substituted or unsubstituted $C_1$–$C_{10}$ alkyl group or benzene derivatives; $R^2$ is hydrogen, halogen or methyl group; $R^3$ is hydrogen or substituted or unsubstituted $C_1$–$C_{10}$ alkyl group; x is number 1-10300; and y is number 0-12100, and is the polymer comprising 10–100 mol % of the maleimide structural unit (A) and 90–0 mol % of the (meth)acrylate structural unit (B), based on the sum of the maleimide structural unit (A) and the (meth)acrylate structural unit (B) in the polymer;

the fifth subject relates to the bottom anti-reflective coat forming composition according to the fourth subject, wherein the maleimide structural unit (A) is 51–95 mol % and the (meth)acrylate structural unit (B) is 49–5 mol % in the structural unit shown in the Formula (2);

the sixth subject relates to the bottom anti-reflective coat forming composition according to any one of the third to fifth subjects, wherein $R^1$ is hydrogen, halogen or substituted or unsubstituted $C_1$–$C_{10}$ alkyl group in the structural unit shown in the Formula (1) or the Formula (2);

the seventh subject relates to the bottom anti-reflective coat forming composition according to any one of the first to sixth subjects, wherein said composition further comprises crosslinking agent having at least two crosslinking forming functional groups;

the eight subject relates to the method of forming the bottom anti-reflective coating for the lithography process in the preparation of semiconductor device, comprising applying the bottom anti-reflective coat forming composition according to any one of the first to seventh subjects over the substrate, and then baking;

the ninth subject relates to the method of the preparation for semiconductor device, comprising applying the bottom anti-reflective coat forming composition according to any one of the first to seventh subjects over the substrate, forming the bottom anti-reflective coating upon baking, coating photoresist over said bottom anti-reflective coating, exposing said substrate, developing and forming integrated circuit elements after transferring the image over the substrate by etching; and the tenth subject relates to the method of the preparation for semiconductor device according to the ninth subject, wherein exposure is conducted with light at 193 nm wavelength.

DESCRIPTION OF THE PREFERRED EMBODIMENTS

The present invention relates to the bottom anti-reflective coat forming composition for the lithography process in the preparation of semiconductor device with the resin having the structural unit comprising maleimide or maleimide derivative thereof. The resin comprises the structural unit comprising maleimide or maleimide derivative in the principal chain or the side chain therein.

Molecular weight of the resin forming the bottom anti-reflective coating of the present invention is 700–1000000, preferably 700–100000, more preferably 700–50000 as the weight-average molecular weight, although they may vary depending on coating solvent, solution viscosity, film configuration and the like being used.

The dry solid content in the bottom anti-reflective coat forming composition of the present invention is 0.1–50% by weight.

It is preferred that said resin is the polymer at least comprising the structural unit shown in the Formula (1) comprising maleimide, derivative thereof, or the combination thereof.

Said resin may be the polymer having the structural unit shown in the Formula (2). In the structural unit shown in the Formula (2), the maleimide structural unit (A) comprising maleimide, maleimide derivative or the combination thereof is the essential component, and the (meth)acrylate structural unit (B) comprising acrylic acid, halogenated acrylic acid, methacrylic acid, said acid ester or the combination thereof can be optionally incorporated. The proportion of both structural units are 10–100 mol % for the maleimide structural unit (A) and 90–0 mol % for the (meth)acrylate structural unit (B) based on the sum of the maleimide structural unit (A) and the (meth)acrylate structural unit (B) contained in the polymer.

Here, $R^1$ is hydrogen, halogen, substituted or unsubstituted $C_1$–$C_{10}$ alkyl group or benzene derivative. However, when $R^1$ is aromatic group such as benzene derivative or the like, the dry etching rate compares unfavorably with when $R^1$ is hydrogen, halogen or substituted or unsubstituted $C_1$–$C_{10}$ alkyl group. Therefore, $R^1$ is preferably hydrogen, halogen or substituted or unsubstituted $C_1$–$C_{10}$ alkyl group. Examples of halogen are fluorine, chlorine and bromine. Examples of alkyl group are methyl group, ethyl group, propyl group and butyl group.

When the composition of the present invention having the polymer comprising the structural unit shown in the Formula (2) is used as the bottom anti-reflective coating, the dry etching rate is increased along with the increase in the introduced amount of the structural unit (A) comprising maleimide, maleimide derivative or the combination thereof. Therefore, it is especially preferred that the maleimide structural unit (A) is 51–95 mol % and the (meth)acrylate structural unit (B) is 49–5 mol %.

Although the ratio of the maleimide structural unit (A) and the (meth)acrylate structural unit (B) is marked with mol %, the more the content of the maleimide structural unit (A) than that of the (metha)acrylate structural unit (B) per unit weight of the polymer comprising the structural unit shown in the Formula (2), the better the dry etching rate becomes. Therefore, the preferable value of the ratio is the same even if it is marked with weight %.

The content of said resin in the bottom anti-reflective coat forming composition is 0.1–50 parts by weight, preferably 1–30 parts by weight, based on 100 parts by weight of the total composition.

The polymer comprising the structural unit shown in the Formula (2) can be obtained by polymerizing monomer composed of maleimide, maleimide derivative or the combination thereof and monomer composed of acrylic acid, halogenated acrylic acid, methacrylic acid, their esters or the combination of said acid.

The resin according to the present invention may be any one of random copolymer, block copolymer or graft copolymer. Said resin in the bottom anti-reflective coat forming composition of the present invention can be synthesized with the method such as radical polymerization, anion polymerization, cation polymerization or the like. A varieties of form such as solution polymerization, suspension polymerization, emulsion polymerization, mass polymerization and the like can be used for the method.

The bottom anti-reflective coat forming composition of the present invention can further contain a crossliking agent having at least two crosslinking forming functional groups. Examples of the crossliking agent are melamine series, substituted urea series, polymer series containing epoxy group and the like. The compound is preferably methoxy methylated glycoluril or methoxy methylated melamine among others, and especially preferred is tetramethoxymethylglycoluril or hexamethoxymethylmelamine. Although the amount of the crosslinking agent to be added may vary depending on coating solvent, ground substrate used, required solution viscosity, required film form and the like, the amount is 0.001–20 parts by weight, preferably 0.01–10 parts by weight, or more preferably 0.1–5 parts by weight, based on 100 parts by weight of said polymer. The crosslinking reaction between these crosslinking agents and the polymer having the structural unit shown in the Formula (1) or (2) proceeds at $R^1$ and $R^3$ parts. The crosslinking reaction can proceed with the crosslinking agent in the case of $R^1$ being hydrogen or alkyl group substituted with hydroxyl group. In addition, the crosslinking reaction can proceed with the crosslinking agent in the case of $R^3$ being hydrogen or alkyl group substituted with hydroxyl group.

However, the crosslinking reaction should be initiated at $R^3$ when $R^1$ is organic group unable to do the crosslinking reaction, and the structural unit (B) comprising acrylic acid, halogenated acrylic acid, methacrylic acid, esters of said acid or the combination thereof becomes necessary in this case. Therefore, the existence of the part where the crosslinking reaction can proceed is preferred at either one of the structural unit (A) or the structural unit (B), or the both.

It is possible further to copolymerize non-crosslinking monomer to monomer forming the structural unit (A) or monomer forming the structural unit (A) and (B) for the resin used in the bottom anti-reflective coat forming composition of the present invention, and thus fine adjustment such as dry etching rate, reflectance and the like can be made. Examples of such copolymerization monomer are as described below. For example, it is the compound having one addition polymerization unsaturated bond selected from acrylic acid ester group, acrylamide group, methacrylic acid ester group, methacrylamid group, allyl compound, vinylether group, vinyl ester group, styrene group, crotonic acid ester group and the like.

Example of acrylic acid ester group is such as alkylacrylate with 1–10 carbons in alkyl group.

Example of methacrylic acid ester group is such as alkylmethacrylate with 1–10 carbons in alkyl group.

Examples of acrylamide group are such as acrylamide, N-alkylacrylamide, N-arylacrylamide, N,N-dialkylacrylamide, N,N-diarylacrylamide, N-methyl-N-phenylacrylamide, N-hydroxyethyl-N-methylacrylamide, N-(2-acetamidoethyl)-N-acetylacrylamide and the like.

Examples of methacrylamide group are such as methacrylamide, N-alkylmethacrylamide, N-arylmethacrylamide, N,N-dialkylmethacrylamide, N,N-diarylmethacrylamide, N-hydroxyethyl-N-methylmethacrylamide, N-methyl-N-phenylmethacrylamide, N-ethyl-N-phenylmethacrylamide and the like.

Examples of vinylether group are such as alkylvinylether and vinylarylether.

Examples of vinylester group are such as vinylbutylate, vinylisobutylate and vinyltrimethylacetate.

Examples of styrene group are such as styrene, alkylstyrene, alkoxystyrene, halogenated-styrene, hydroxystyrene and carboxystyrene.

Example of crotonic acid ester group is crotonic acid alkyl such as crotonic acid butyl, crotonic acid hexyl, glycerol monocrotonate and the like.

In addition, itaconic acid dialkyl group, maleic acid or fumaric acid dialkylester group or monoalkylester group, crotonic acid, itaconic acid, maleic acid anhydride, maleimide, acrylonitrile, methacrylonitrile, maleylnitrile and the like can be used. In addition, any addition polymerization unsaturated compound which is in general copolymerizable with monomer forming the structural unit (A) or monomer forming the structural unit (B) can be used.

Further, light absorber, rheology adjustor, co-adhesive agent, surfactant and the like in addition to one described above can be, if necessary, added to the bottom anti-reflective coat forming composition of the present invention.

Rheology adjustor is added in order to mainly improve flow properties of the bottom anti-reflective coat forming composition, and thus to improve filling properties of the bottom anti-reflective coat forming composition into the hole's inner part, especially in the bake process. Concrete examples are phthalic acid derivatives such as dimethyl phthalate, diethyl phthalate, diisobutyl phthalate, dihexyl phthalate, butylisodecyl phthalate and the like, adipic acid derivatives such as di (n-butyl) adipate, diisobutyl adipate, diisooctyl adipate, octyldecyl adipate and the like, maleic acid derivatives such as di (n-butyl) maleate, diethyl maleate, dinonyl maleate and the like, oleic acid derivatives such as methyl oleate, butyl oleate, tetrahydrofurfuryl oleate and the like, or stearic acid derivatives such as n-butyl stearate, glyceryl stearate and the like. These rheology adjustor can be normally compounded in the ratio of less than 30 parts by weight based on 100 parts by weight of the total composition.

Co-adhesive agent is added in order to mainly improve adherence of substrate or resist with the bottom anti-reflective coat forming composition, and thus to prevent resist pattern collapse, especially in development. Concrete examples are chlorosilane group such as trimethyl chlorosilane, dimethylvinyl chlorosilane, methylphenyl chlorosilane, chloromethyl dimethyl chlorosilane and the like, alkoxy silane group such as trimethyl methoxy silane, dimethyl diethoxy silane, methyl dimethoxy silane, dimethyl vinylethoxy silane, diphenyl dimethoxy silane, phenyl triethoxy silane and the like, silazane group such as hexamethyl disilazane, N,N'-bis (trimethylsilyl) urea, dimethyl trimethylsilylamine, trimethylsilylimidazole and the like, silane group such as vinyl trichlorosilane, γ-chloropropyltrimethoxysilane, γ-aminopropyl triethoxysilane, γ-glycidoxypropyl trimethoxy silane and the like, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine and the like, and urea such as 1,1-dimethylurea, 1,3-dimethylurea and the like or thio urea compound. These co-adhesive agent can be normally compounded in the ratio of less than 5 parts by weight, preferably less than 2 parts by weight, based on 100 parts by weight of the total composition.

Surfactant can be added to the bottom anti-reflective coat forming composition of the present invention to prevent occurrence of pin-hole, striation and the like and to further improve thickness uniformity of the various location on the substrate. Examples of surfactant are nonionic surfactant, for example, polyoxyethylene alkylether group such as polyoxyehtylene laurylether, polyoxyethylene stearylether, polyoxyethylene cetylether, polyoxyethylene oleylether and the like, polyoxyethylene alkylallylether group such as polyoxyethylene octylphenolether, polyoxyethylene nonylphenolether and the like, polyoxyethylene•polyoxypropylene block copolymer group, sorbitan fatty acid ester group such as sorbitan monolaurate, sorbitan monopalmitate, sorbitan monostearate, sorbitan monooleate, sorbitan trioleate, sorbitan tristearate and the like, and polyoxyethylene sorbitan fatty acid ester group such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate and the like; flourine family surfactant such as Eftop EF301, EF303, EF352 (produced by ToChem Products K.K.), Megafac F171, F173 (produced by Dai Nippon Ink and Chemicals, Inc.), Florad FC430, FC431 (produced by Sumitomo 3M K.K.), Asahiguard AG710, Surflon S-382, SC101, SC102, SC103, SC104, SC105, SC106 (produced by Asahi Glass Co., Ltd.) and the like; and organosiloxane polymer KP341 (produced by Shin-Etsu Chemical Co., Ltd.) among others. The amount of these surfactants to be compounded is normally less than 0.2 part by weight, preferably less than 0.1 part by weight, based on 100 parts by weight of the total composition of the present invention. These surfactants can be added by itself, or in the combination of more than two kinds can be added.

Examples of solvent to dissolve said resin in the present invention are ethyleneglycol monomethylether, ethyleneglycol monoethylether, methylcellosolve acetate, ethylcellosolve acetate, diethyleneglycol monomethylether, diethyleneglycol monoethylether, propyleneglycol, propyleneglycol monomethylether, propyleneglycol monomethylether acetate, propyleneglycol propylether acetate, toluene, xylene, methylethylketone, cyclopentanone, cyclohexanone, 2-hydroxypropionic acid ethyl ester, 2-hydroxy-2-methylpropionic acid ethyl ester, ethoxy acetic acid ethyl ester, hydroxy acetic acid ethyl ester, 2-hydroxy-3-methylbutanoic acid methyl ester, 3-methoxypropionic acid methyl ester, 3-methoxypropionic acid ethyl ester, 3-ethoxypropionic acid ethyl ester, 3-ethoxypropionic acid methyl ester, pyruvic acid methyl ester, pyruvic acid ethyl ester, acetic acid ethyl ester, acetic acid butyl ester, lactic acid ethyl ester, lactic acid butyl ester, cyclohexanone and the like. These organic solvent can be used alone or in the combination of more than two kinds.

In addition, high boiling point solvent such as propyleneglycol monobutylether, propyleneglycol monobutylether acetate and the like can be combined for the use. Propyleneglycol monomethyether, propyleneglycol monomethylether acetate, lactic acid ethyl ester, lactic acid butyl ester and cyclohexanone among these solvents are preferred in terms of improving leveling properties.

Either the negative type or the positive type resist can be used as resist coated over the top layer of the bottom anti-reflective coating of the present invention, and example as such are a positive type resist comprising a novolak resin and 1,2-naphthoquinone diazidesulfonic acid ester, a chemical amplification type resist comprising a photo-acid generator and a binder having group which can increase alkaline dissolving speed by the decomposition with an acid, a chemical amplification type resist comprising a photo-acid generator, an alkaline soluble binder, and a low molecular weight compound which can increase alkaline dissolving speed of resist by the decomposition with an acid, a chemical amplification type resist comprising a photo-acid generator and a binder having group which can increase alkaline dissolving speed by the decomposition with an acid, and a low molecular weight compound which can increase alkaline dissolving speed of resist by the decomposition with an acid, and the like, and for example a product with Trade Name PAR710 by Sumitomo Chemical Co., Ltd. can be mentioned.

As the developer for the positive type photoresist coated over the bottom anti-reflective coating for lithography formed with the use of the bottom anti-reflective coat forming composition of the present invention, an alkaline solution made of, for example, inorganic alkaline group such as sodium hydroxide, potassium hydroxide, sodium carbonate, sodium silicate, sodium metasilicate, aqueous ammonia and the like, primary amine group such as ethyl amine, n-propyl amine and the like, secondary amine group such as diethyl amine, di (n-butyl) amine and the like, tertiary amine group such as triethyl amine, methyldiethyl amine and the like, alcohol amine group such as dimethyl ethanol amine, triethanol amine and the like, quaternary ammonium salt group such as tetramethyl ammonium hydroxide, tetraethyl ammonium hydroxide, choline and the like, and cyclic amine group such as pyrrole, piperidine and the like, can be used. Furthermore, a proper amount of alcohol group such as isopropyl alcohol and the like and surfactant such as nonionic type and the like can be added to said alkaline solution for the use. Preferred developer among them is quaternary ammonium salt, more preferably tetramethyl ammonium hydroxide and choline.

Next, the method of forming resist pattern of the present invention is explained below. The bottom anti-reflective coating is prepared by coating the bottom anti-reflective coat forming composition with the coating method such as spinner, coater and the like over substrate (for example, clear substrate such as silicon/silicon dioxide covering, glass substrate, ITO substrate and the like) used for the preparation of precision integrated circuit elements, and then hardened by baking. Here, 0.01–3.0 µm is preferred as the film thickness of the bottom anti-reflective coating. In addition, the condition for baking after coating is at 80–250° C. for 1–120 minutes. Then, good resist can be obtained by applying photoresist, exposing through the predetermined mask, developing, rinsing and drying. PEB (Post Exposure Bake) can be done if necessary.

EXAMPLE

Examples of the present invention are shown below, but the substance of the present invention is not limited herewith.

Synthetic Example 1

N-methylmaleimide (produced by Tokyo Kasei K.K.) and hydroxypropyl acrylate (produced by Jyunsei Chemical K.K.) were prepared.

33.9 g (0.305 mole) of said N-methylmaleimide and 66.1 g (0.508 mole) of said hydroxypropylacrylate were dissolved in 350 g of tetrahydrofuran, and then temperature of the flask was elevated to reflux temperature under nitrogen atmosphere. 1 g of azobisisobutyronitrile (AIBN) dissolved in 50 g of tetrahydrofuran was added under pressured nitrogen after the initiation of reflux, and reaction was continued for 24 hours. Upon cooling the reaction solution, the solution was introduced into diethylether, the polymer was re-precipitated, dried with heat, and then the polymer comprising the structural unit shown in the Formula (3) was obtained. Weight-average molecular weight of the polymer was 5400. The structural unit A1=37.5 mol %, the structural unit B1=62.5 mol %, and yield was 90%.

Formula (3)

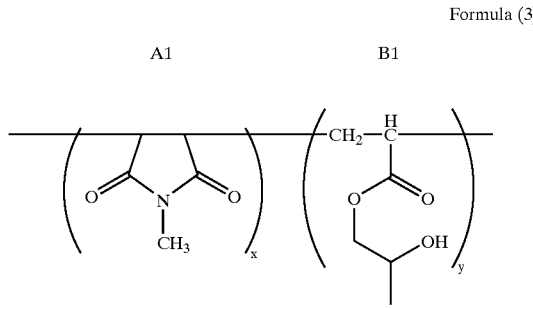

Synthetic Example 2

N-ethylmaleimide (produced by Tokyo Kasei K.K.) and hydroxypropyl methacrylate (produced by Jyunsei Chemical K.K.) were prepared.

50 g (0.400 mole) of said N-ethylmaleimide and 50 g (0.347 mole) of said hydroxypropylmethacrylate were dissolved in 350 g of tetrahydrofuran, and then temperature of the flask was elevated to reflux temperature under nitrogen atmosphere. 1 g of azobisisobutyronitrile dissolved in 50 g of tetrahydrofuran was added under pressured nitrogen after the initiation of reflux, and reaction was continued for 24 hours. Upon cooling the reaction solution, the solution was introduced into diethylether, the polymer was re-precipitated, dried with heat, and then the polymer comprising the structural unit shown in the Formula (4) was obtained. Weight-average molecular weight of the polymer was 6200. The structural unit A2=53 mol %, the structural unit B2=47 mol %, and yield was 90%.

Formula (4)

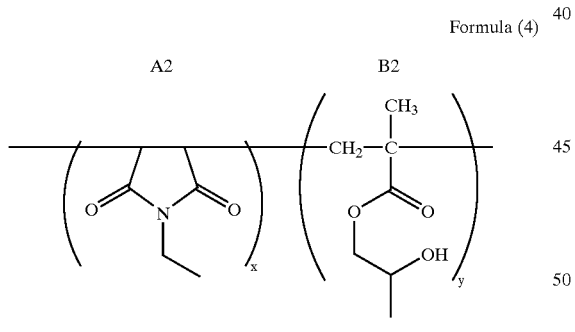

Synthetic Example 3

Hydroxyethylmaleimide (produced by OGRGANIX) and hydroxypropyl acrylate (produced by Jyunsei Chemical K.K.) were prepared.

55 g (0.400 mole) of said hydroxyethylmaleimide and 50 g (0.347 mole) of said hydroxypropylacrylate were dissolved in 350 g of tetrahydrofuran, and then temperature of the flask was elevated to reflux temperature under nitrogen atmosphere. 1 g of azobisisobutyronitrile dissolved in 50 g of tetrahydrofuran was added under pressured nitrogen after the initiation of reflux, and reaction was continued for 24 hours. Upon cooling the reaction solution, the solution was introduced into diethylether, the polymer was re-precipitated, dried with heat, and then the polymer comprising the structural unit shown in the Formula (5) was obtained. Weight-average molecular weight of the polymer was 5100. The structural unit A3=53 mol %, the structural unit B3=47 mol %, and yield was 90%.

Formula (5)

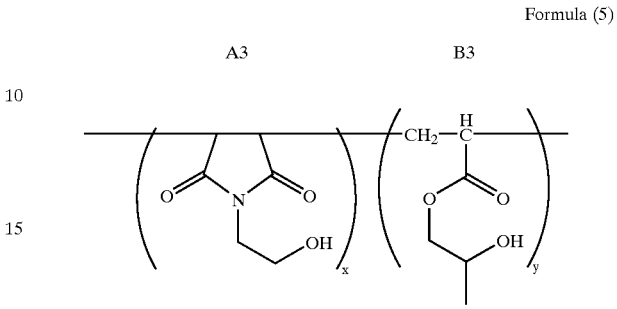

Synthetic Example 4

Phenylmaleimide (produced by Tokyo Kasei K.K.) and hydroxypropyl acrylate (produced by Jyunsei Chemical K.K.) were prepared.

50 g (0.289 mole) of said phenylmaleimide and 50 g (0.347 mole) of said hydroxypropylacrylate were dissolved in 350 g of tetrahydrofuran, and then temperature of the flask was elevated to reflux temperature under nitrogen atmosphere. 1 g of azobisisobutyronitrile dissolved in 50 g of tetrahydrofuran was added under pressured nitrogen after the initiation of reflux, and reaction was continued for 24 hours. Upon cooling the reaction solution, the solution was introduced into diethylether, the polymer was re-precipitated, dried with heat, and then the polymer comprising the structural unit shown in the Formula (6) was obtained. Weight-average molecular weight of the polymer was 6600. The structural unit A4=45.5 mol %, the structural unit B4=54.5 mol %, and yield was 90%.

Formula (6)

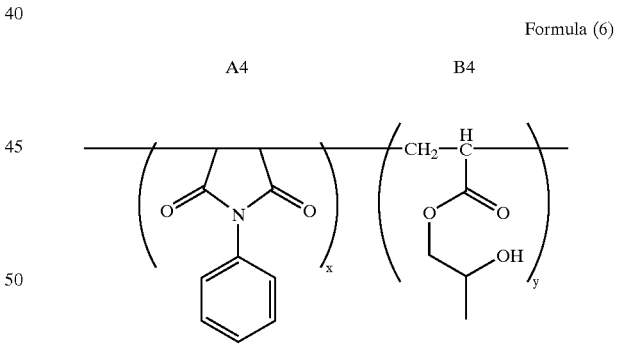

Synthetic Example 5

Maleimide (produced by Tokyo Kasei K.K.) and hydroxypropyl methacrylate (produced by Jyunsei Chemical K.K.) were prepared.

42.9 g (0.442 mole) of said maleimide and 57.1 g (0.397 mole) of said hydroxypropylmethacrylate were dissolved in 350 g of tetrahydrofuran, and then temperature of the flask was elevated to reflux temperature under nitrogen atmosphere. 1 g of azobisisobutyronitrile dissolved in 50 g of tetrahydrofuran was added under pressured nitrogen after the initiation of reflux, and reaction was continued for 24 hours. Upon cooling the reaction solution, the solution was introduced into diethylether, the polymer was re-precipitated, dried with heat, and then the polymer comprising the structural unit shown in the Formula (7) was obtained. Weight-average molecular weight of the polymer was 4400. The structural unit A5=52.7 mol %, the structural unit B5=47.3 mol %, and yield was 90%.

Formula (7)

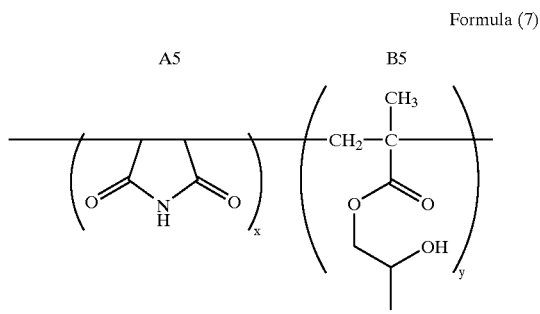

Synthetic Example 6

Cresol novolak resin (produced by Asahi Chiba K.K., Product Name ECN1299, weight-average molecular weight 3900, structure shown in the Formula (8)) was prepared.

Formula (8)

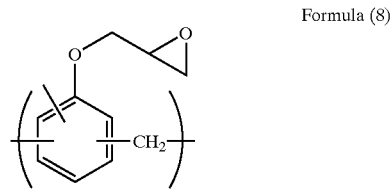

10 g of said cresol novlak resin was added to 80 g of propyleneglycol monomethylether and dissolved. Upon the addition of 9.7 g of 9-anthracenecarboxylic acid and 0.26 g of benzyltriethylammoniumchloride to the dissolved solution, the content was reacted for 24 hours at 105° C. GPC analysis of the polymer obtained showed weight-average molecular weight of 5600 calculated in terms of standard polystyrene. The structure of the polymer obtained is shown below in the Formula (9).

Formula (9)

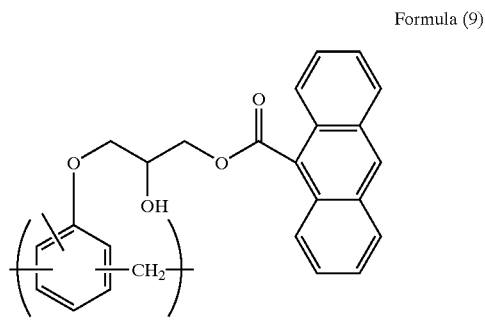

Example 1

4 g of hexamethoxymethylmelamine as a crosslinking agent and 0.4 g of p-toluenesulfonic acid as a hardner were mixed into 80 g of propyleneglycol monomethylether solution containing 16 g of the polymer obtained in Synthetic example 1 described above, and then dissolved in 316 g of propyleneglycol monomethylether solvent to make 5.1% solution, and then filtered through a micro-filter made by polyethylene with a pore size of 0.10 μm. Thereafter, the bottom anti-reflective coating composition was prepared by filtration with the use of a micro-filter made by polyethylene with a pore size of 0.05 μm. The obtained solution was applied over silicon wafer with a spinner. The wafer was heated on the hot plate for one minute at 205° C., and the bottom anti-reflective coating (film thickness of 0.11 μm) was formed. Upon the analysis of this bottom anti-reflective coating with a spectroscopic ellipsometer, refractive index "n" at 193 nm was 1.71 and optical absorption factor "k" was 0.19.

Example 2

4 g of tetramethoxymethylglycoluril as a crosslinking agent and 0.4 g of pyridinium p-toluenesulfonate as a hardner were mixed into 80 g of propyleneglycol monomethylether solution containing 16 g of the polymer obtained in Synthetic example 2 described above, and then dissolved in 316 g of propyleneglycol monomethylether solvent to make 5.1% solution, and then filtered through a micro-filter made by polyethylene with a pore size of 0.10 μm. Thereafter, the bottom anti-reflective coating composition was prepared by filtration with the use of a micro-filter made by polyethylene with a pore size of 0.05 μm. The obtained solution was applied over silicon wafer with a spinner. The wafer was heated on the hot plate for one minute at 205° C., and the bottom anti-reflective coating (film thickness of 0.11 μm) was formed. Upon the analysis of this bottom anti-reflective coating with a spectroscopic ellipsometer, refractive index "n" at 193 nm was 1.69 and optical absorption factor "k" was 0.23.

Example 3

4 g of hexamethoxymethylmelamine as a crosslinking agent and 0.4 g of p-toluenesulfonic acid as a hardner were mixed into 80 g of propyleneglycol monomethylether solution containing 16 g of the polymer obtained in Synthetic example 3 described above, and then dissolved in 316 g of propyleneglycol monomethylether solvent to make 5.1% solution, and then filtered through a micro-filter made by polyethylene with a pore size of 0.10 μm. Thereafter, the bottom anti-reflective coating composition was prepared by filtration with the use of a micro-filter made by polyethylene with a pore size of 0.05 μm. The obtained solution was applied over silicon wafer with a spinner. The wafer was heated on the hot plate for one minute at 205° C., and the bottom anti-reflective coating (film thickness of 0.11 μm) was formed. Upon the analysis of this bottom anti-reflective coating with a spectroscopic ellipsometer, refractive index "n" at 193 nm was 1.70 and optical absorption factor "k" was 0.20.

Example 4

4 g of tetramethoxymethylglycoluril as a crosslinking agent and 0.4 g of pyridinium p-toluenesulfonate as a hardner were mixed into 80 g of propyleneglycol monomethylether solution containing 16 g of the polymer obtained in Synthetic example 4 described above, and then dissolved in 316 g of propyleneglycol monomethylether solvent to make 5.1% solution, and then filtered through a micro-filter made by polyethylene with a pore size of 0.10 μm. Thereafter, the bottom anti-reflective coating composition was prepared by filtration with the use of a micro-filter made by polyethylene with a pore size of 0.05 μm. The obtained solution was applied over silicon wafer with a spinner. The wafer was heated on the hot plate for one minute at 205° C., and the bottom anti-reflective coating (film thickness of 0.11 μm) was formed. Upon the analysis of this bottom anti-reflective coating with a spectroscopic ellipsometer, refractive index "n" at 193 nm was 1.74 and optical absorption factor "k" was 0.33.

Example 5

4 g of hexamethoxymethylmelamine as a crosslinking agent and 0.4 g of p-toluenesulfonic acid as a hardner were mixed into 80 g of propyleneglycol monomethylether solution containing 16 g of the polymer obtained in Synthetic example 5 described above, and then dissolved in 316 g of propyleneglycol monomethylether solvent to make 5.1% solution, and then filtered through a micro-filter made by polyethylene with a pore size of 0.10 μm. Thereafter, the bottom anti-reflective coating composition was prepared by filtration with the use of a micro-filter made by polyethylene with a pore size of 0.05 μm. The obtained solution was applied over silicon wafer with a spinner. The wafer was heated on the hot plate for one minute at 205° C., and the bottom anti-reflective coating (film thickness of 0.15 μm) was formed. Upon the analysis of this bottom anti-reflective coating with a spectroscopic ellipsometer, refractive index "n" at 193 nm was 1.74 and optical absorption factor "k" was 0.31.

Comparative Example 1

0.53 g of hexamethoxymethylmelamine as a crosslinking agent and 0.05 g of p-toluenesulfonic acid as a hardner were mixed into 10 g of solution containing 2 g of the polymer obtained in Synthetic example 6 described above, and then dissolved in solvent comprising 14.3 g of lactic acid ethyl ester, 1.13 g of propyleneglycolmonomethylether and 2.61 g of cyclohexanone to make 9% solution, and then filtered through a micro-filter made by polyethylene with a pore size of 0.10 μm. Thereafter, the bottom anti-reflective coating composition was prepared by filtration with the use of a micro-filter made by polyethylene with a pore size of 0.05 μm. The obtained solution was applied over silicon wafer with a spinner. The wafer was heated on the hot plate for one minute at 205° C., and the bottom anti-reflective coating (film thickness of 0.23 μm) was formed. Upon the analysis of this bottom anti-reflective coating with a spectroscopic ellipsometer, refractive index "n" at 193 nm was 1.60 and optical absorption factor "k" was 0.47.

Example 6

The compositions obtained in Examples 1–5 and Comparative example 1 above were applied over silicon wafer with a spinner. The wafers were heated on the hot plate for one minute at 205° C., and the bottom anti-reflective coating (film thickness of 0.23 μm) was formed. This bottom anti-reflective coating was immersed in solvent used for resist, for example lactic acid ethyl ester as well as propyleneglycolmonomethylether, and the fact that the coating was insoluble in these solvents was confirmed.

Example 7

The compositions obtained in Examples 1–5 and Comparative example 1 above were applied over silicon wafer with a spinner. The wafers were heated on the hot plate for one minute at 205° C., and the bottom anti-reflective coating was formed. The film thickness (film thickness of 0.23 μm) was measured. Photoresist solution available on the market (Product Name PAR710 produced by Sumitomo Chemical Co., Ltd.) was applied with a spinner on the top layer of the bottom anti-reflective coating for lithography. It was heated on a hot plate for one minute at 90° C., resist was exposed, and then post exposure bake was done for 1.5 minute at 90° C. The film thickness was measured after resist development. The fact that intermixing do not occur between the bottom anti-reflective coating for lithography obtained in Examples 1–5 and Comparative example 1 and resist layer was confirmed.

Example 8

Dry etching was done for the bottom anti-reflective coatings formed from the compositions obtained in Examples 1–5 and Comparative example 1 according to the same method with Example 6 and Example 7 under the same condition. The dry etching selectivity is shown in Table 1 below for the dry etching rate of the bottom anti-reflective coating when the dry etching rate of photoresist is set at 1.00.

TABLE 1

| | Refractive index (n value) | Optical absorption factor (k value) | Dry etching selectivity |
|---|---|---|---|
| Example 1 | 1.71 | 0.19 | 1.55 |
| Example 2 | 1.69 | 0.23 | 1.58 |
| Example 3 | 1.70 | 0.20 | 1.57 |
| Example 4 | 1.74 | 0.33 | 1.22 |
| Example 5 | 1.74 | 0.31 | 1.62 |
| Comp. example 1 | 1.60 | 0.47 | 0.88 |

Etching characteristics of the bottom anti-reflective coating obtained from the bottom anti-reflective coat forming composition according to Examples 1–5 were higher in comparison to the known bottom anti-reflective coating of Comparative example 1. In particular, the fact that the more the amount of maleimide introduced as in Examples 2–3 and Example 5, the greater the etching rate became was confirmed.

The bottom anti-reflective coating of Examples at exposure light of 193 nm have greater dry etching rate while maintaining practical refractive index and optical absorption factor.

The bottom anti-reflective coat forming composition of the present invention is the composition for forming the bottom anti-reflective coating having greater dry etching rate. The bottom anti-reflective coating thus obtained is effective not only for the anti-reflective effect but also for the fast removal at the time of dry etching process of the ground substrate.

The superior composition for the bottom anti-reflective coating material showing larger dry etching rate in comparison to resist layer, high anti-reflective effect, additionally no intermixing with resist layer, no diffusing object into resist while heat drying, high resolving power and excellent resist film thickness dependence can be obtained according to the present invention in addition to offering the excellent resist pattern forming method.

What is claimed is:
1. A bottom anti-reflective coat forming composition for lithography processes in semiconductor device preparation, wherein the bottom anti-reflective coat forming composition has improved dry etching rate, and comprises resin containing a structural unit comprising maleimide or a derivative thereof, wherein the resin comprises the structural unit shown in Formula (2)

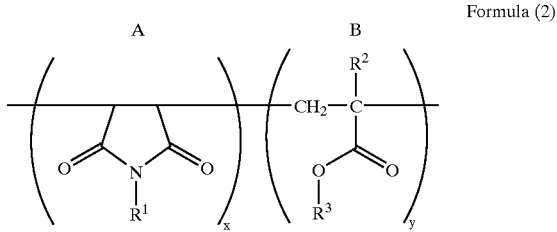

Formula (2)

wherein each $R^1$, $R^2$ and $R^3$ is independent of one another; $R^1$ is hydrogen, halogen, or substituted or unsubstituted $C_1$–$C_{10}$ alkyl group; $R^2$ is hydrogen, halogen or methyl group; $R^3$ is hydrogen or substituted or unsubstituted $C_1$–$C_{10}$ alkyl group; x is number 1-10300; and y is number 0-12100, and is a polymer comprising 10–95 mol % of the maleimide structural unit (A) and 90–5 mol % of the (meth)acrylate structural unit (B), based on the sum of the maleimide structural unit (A) and the (meth)acrylate structural unit (B) in the polymer, and wherein said composition further comprises crosslinking agent having at least two crosslinking forming functional groups.

2. The bottom anti-reflective coat forming composition according to claim 1, wherein the maleimide structural unit (A) is 51–95 mol % and the (meth)acrylate structural unit (B) is 49–5 mol % in the structural unit shown in the Formula (2).

3. The bottom anti-reflective coat forming composition according claim 1, wherein $R^1$ is hydrogen, halogen or substituted or unsubstituted $C_1$–$C_{10}$ alkyl group in the structural unit shown in the Formula (2).

4. A method of forming a bottom anti-reflective coating for lithography processes in semiconductor device preparation, comprising applying the bottom anti-reflective coat forming composition according to claim 1 over a substrate, and then baking.

5. A method of semiconductor device preparation, comprising:

applying the bottom anti-reflective coat forming composition according to claim 4 over a substrate, baking the coated substrate to form a bottom anti-reflective coating upon baking, coating photoresist over said bottom anti-reflective coating, exposing said substrate to form an image, transferring the image over the substrate by etching, and developing and forming integrated circuit elements.

6. The method of semiconductor device preparation according to claim 5, wherein exposure is conducted with light at 193 nm wave-length.

* * * * *